United States Patent
Kwon et al.

(10) Patent No.: US 10,305,457 B2
(45) Date of Patent: May 28, 2019

(54) VOLTAGE TRIMMING CIRCUIT AND INTEGRATED CIRCUIT INCLUDING THE VOLTAGE TRIMMING CIRCUIT

(71) Applicant: SAMSUNG ELECTRONICS CO., LTD., Suwon-si, Gyeonggi-do (KR)

(72) Inventors: Hye Jung Kwon, Seoul (KR); Younghun Seo, Hwaseong-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 15/844,172

(22) Filed: Dec. 15, 2017

(65) Prior Publication Data
US 2018/0337663 A1 Nov. 22, 2018

(30) Foreign Application Priority Data
May 22, 2017 (KR) .................. 10-2017-0062871

(51) Int. Cl.
| | |
|---|---|
| H03L 5/00 | (2006.01) |
| H03K 5/08 | (2006.01) |
| H03K 5/24 | (2006.01) |
| G05F 1/46 | (2006.01) |
| G05F 1/575 | (2006.01) |

(52) U.S. Cl.
CPC .......... *H03K 5/08* (2013.01); *G05F 1/46* (2013.01); *G05F 1/575* (2013.01); *H03K 5/24* (2013.01)

(58) Field of Classification Search
CPC .............. H03K 5/08; H03K 5/24; G05F 1/46
USPC ........................................................ 327/307
See application file for complete search history.

(56) References Cited

U.S. PATENT DOCUMENTS

| | | | | |
|---|---|---|---|---|
| 5,459,684 A | * | 10/1995 | Nakamura | G11C 11/4074 365/149 |
| 6,949,971 B2 | * | 9/2005 | Jang | G05F 1/465 323/316 |
| 7,863,876 B2 | * | 1/2011 | Cook | G05F 1/575 323/280 |
| 7,907,002 B2 | * | 3/2011 | Bracmard | G01R 31/31703 323/313 |
| 8,148,970 B2 | * | 4/2012 | Fuse | G11C 5/147 323/313 |

(Continued)

FOREIGN PATENT DOCUMENTS

| | | |
|---|---|---|
| JP | H07-169915 A | 7/1995 |
| JP | 2000-150799 A | 5/2000 |

*Primary Examiner* — Ryan Jager
(74) *Attorney, Agent, or Firm* — Volentine, Whitt & Francos, PLLC

(57) ABSTRACT

A voltage trimming circuit includes a comparator, a code generator, nonvolatile storage device, a switch circuit, and a voltage generator. The comparator compares a reference voltage with a feedback voltage. The code generator generates a plurality of trimming codes for trimming the feedback voltage based on the comparison result of the comparator. If the feedback voltage is less than the reference voltage, the code generator adjusts up codes to increase the feedback voltage, from among the plurality of trimming codes and maintains down codes to decrease the feedback voltage, from among the plurality of trimming codes at an initial value. If the feedback voltage is greater than the reference voltage, the code generator adjusts the down codes and maintains the up codes at an initial value.

20 Claims, 12 Drawing Sheets

(56) References Cited

U.S. PATENT DOCUMENTS

| | | | |
|---|---|---|---|
| 8,278,996 B2* | 10/2012 | Miki | G11C 5/147 |
| | | | 327/103 |
| 8,280,672 B2 | 10/2012 | Kim | |
| 8,446,304 B2 | 5/2013 | Scanlan | |
| 8,680,902 B1* | 3/2014 | Wright | G06F 1/24 |
| | | | 327/143 |
| 9,052,730 B2* | 6/2015 | Chen | G05F 1/575 |
| 9,111,603 B1 | 8/2015 | Wang et al. | |
| 10,033,268 B2* | 7/2018 | Pan | H02M 3/07 |

\* cited by examiner

VOLTAGE TRIMMING CIRCUIT AND INTEGRATED CIRCUIT INCLUDING THE VOLTAGE TRIMMING CIRCUIT

CROSS-REFERENCE TO RELATED APPLICATIONS

This application claims priority under 35 U.S.C. § 119 to Korean Patent Application No. 10-2017-0062871 filed on May 22, 2017 in the Korean Intellectual Property Office, the contents of which are herein incorporated by reference in their entirety.

BACKGROUND

Embodiments of the inventive concept described herein relate to a voltage trimming circuit, an operating method thereof, and an integrated circuit including the voltage trimming circuit, and more particularly to a voltage trimming circuit including anti-fuses, an operating method thereof, and an integrated circuit including the voltage trimming circuit.

An integrated circuit may generate internal voltages by using a driving voltage (e.g., VDD). The internal voltages may not be accurately set to desired voltage levels and it may be required to trim or adjust their levels. To trim the internal voltages, a test device (external device of the integrated circuit) may read the internal voltages through a pad(s) of the integrated circuit. A test time may be increased due to the voltage level trimming times which includes a time for the test device to read the internal voltages and a time to control internal circuit in the integrated circuit to trim the internal voltages. The increase in the test time of the integrated circuit may lower the production yield of the integrated circuit.

Also, in the case where the test device adjusts the internal voltages of the integrated circuit, an internal voltage may fail to be set to a reference voltage or a target voltage accurately due to unique resolution of the test device. In particular, it may be important to set an internal voltage more accurately because a driving voltage is reduced as the integrated circuit is finely manufactured.

For solving the problems mentioned above, a voltage trimming circuit is suggested to adjust an internal voltage of an integrated circuit internally.

SUMMARY

Embodiments of the inventive concept provide a voltage trimming circuit including anti-fuses, an operating method thereof, and an integrated circuit including the voltage trimming circuit.

According to an aspect of an embodiment, a voltage trimming circuit includes a comparator, a code generator, a nonvolatile storage device, a switch circuit, and a voltage generator. The comparator is configured to compare a reference voltage with a feedback voltage. The code generator is configured to generate a plurality of trimming codes for trimming the feedback voltage based on the comparison result of the comparator. If the comparison result indicates that the feedback voltage is to be increased, the code generator adjusts up codes of the plurality of trimming codes to increase the feedback voltage and maintains down codes of the plurality of trimming codes with an initial value. If the comparison result indicates that the feedback voltage is to be decreased, the code generator adjusts the down codes of the plurality of trimming codes and maintains the up codes with an initial value. The nonvolatile storage device is configured to store a plurality of final trimming codes adjusted by the code generator. The switch circuit is configured to select the plurality of trimming codes during a trimming mode and to select the plurality of final trimming codes after the trimming mode. The voltage generator is configured to generate the feedback voltage based on the plurality of trimming codes selected by the switch circuit.

According to another aspect of an embodiment, an operating method of a voltage trimming circuit includes comparing a reference voltage with a feedback voltage by using a comparator, adjusting up codes to increase the feedback voltage and down codes to decrease the feedback voltage, and programming the up codes and the down codes in an anti-fuse array including a plurality of anti-fuses after the up codes and the down codes are adjusted. The adjusting includes setting values of the up codes so that the feedback voltage is to be increased if the comparison result indicates that the feedback voltage is to be increased, and setting values of the down codes so that the feedback voltage is to be decreased if the comparison result indicates that the feedback voltage is to be decreased.

According to another aspect of an embodiment, an integrated circuit includes a first switch circuit, a comparator, a code generator, a nonvolatile storage device, a second switch circuit, and a plurality of voltage generators. The first switch circuit is configured to select a plurality of internal voltages of the integrated circuit. The comparator is configured to compare an internal voltage selected by the first switch circuit from among the plurality of internal voltages with a reference voltage. The code generator is configured to adjust a plurality of trimming codes for trimming each of the plurality of internal voltages based on the comparison result of the comparator. The nonvolatile storage device is configured to store a plurality of final trimming codes adjusted by the code generator. The second switch circuit is configured to select the plurality of trimming codes during a trimming mode and to select the plurality of final trimming codes after the trimming mode. The plurality of voltage generators are configured to generate the plurality of internal voltages based on the plurality of trimming codes selected by the second switch circuit. Each of the plurality of trimming codes includes up codes to increase the plurality of internal voltages and down codes to decrease the plurality of internal voltages. If the code generator adjusts any ones of the up codes and the down codes, the code generator maintains the others of the up codes and the down codes with an initial value.

DETAILED DESCRIPTION

Embodiments of the inventive concept may be described in detail and clearly to such an extent that an ordinary one in the art easily implements the inventive concept.

Figure 1:
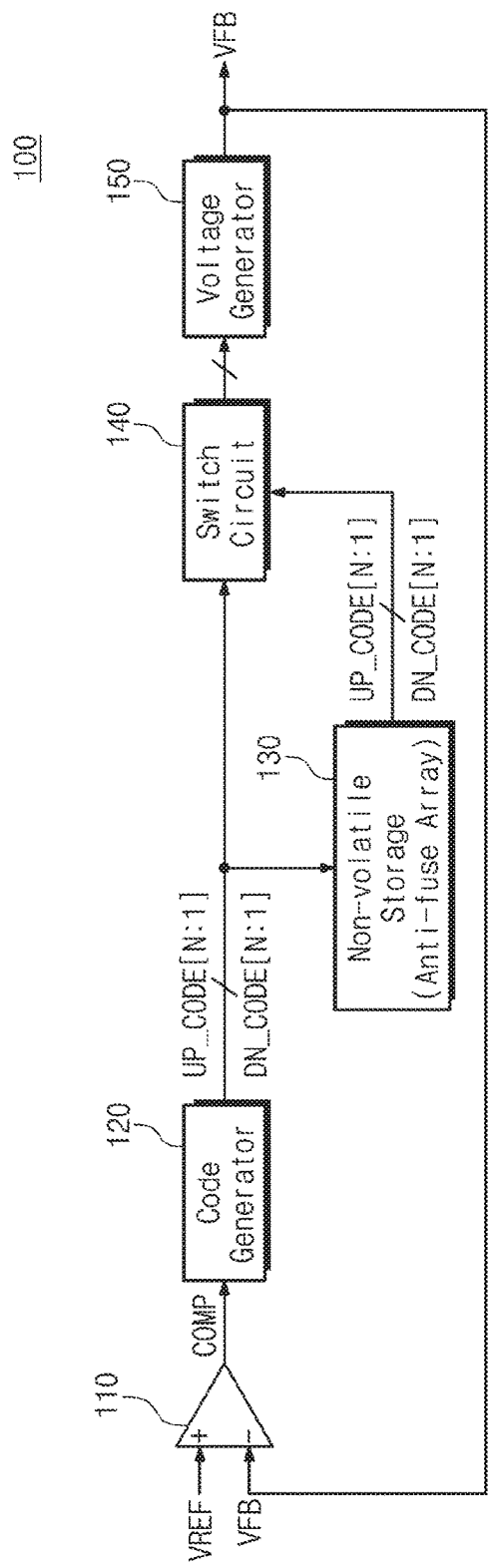
FIG. 1 is a block diagram illustrating a voltage trimming circuit according to an embodiment of the inventive concept.

FIG. 1 is a block diagram illustrating a voltage trimming circuit according to an embodiment of the inventive concept. Referring to FIG. 1, a voltage trimming circuit 100 may include a comparator 110, a code generator 120, a nonvolatile storage device 130, a switch circuit 140, and a voltage generator 150. The voltage trimming circuit 100 may set a feedback voltage VFB to a reference voltage VREF. Elements of the voltage trimming circuit 100 will be described in detail.

The comparator 110 may compare the reference voltage VREF with the feedback voltage VFB and may generate a comparison result COMP. The reference voltage VREF may be a voltage provided from the outside of the voltage trimming circuit 100, and the feedback voltage VFB may be a voltage generated by the voltage generator 150 using a driving voltage (e.g., VDD) of the voltage trimming circuit 100. The feedback voltage VFB may be provided to another circuit (e.g., a circuit in an integrated circuit including the voltage trimming circuit 100) not illustrated in FIG. 1.

In an embodiment, the comparator 110 may be an operational amplifier. Offset cancellation may be performed first before the comparator 110 compares the reference voltage VREF with the feedback voltage VFB.

The comparator 110 may receive the reference voltage VREF through a non-inverting input terminal (or referred to as a "positive input terminal") and may receive the feedback voltage VFB through an inverting input terminal (or referred to as a "negative input terminal"). In an embodiment, if the feedback voltage VFB is higher than the reference voltage VREF, the comparison result COMP may be low; if the feedback voltage VFB is lower than the reference voltage VREF, the comparison result COMP may be high. The comparison result COMP may be a digital signal.

The code generator 120 may generate up codes UP_CODE[N:1] and down codes DN_CODE[N:1] based on the comparison result COMP. Here, "N" is a natural number of 1 or more. The code generator 120 may adjust the up codes UP_CODE[N:1] and the down codes DN_CODE[N:1] such that the feedback voltage VFB is set to the reference voltage VREF. Here, the up codes UP_CODE[N:1] and the down codes DN_CODE[N:1] may be a plurality of trimming codes for trimming the feedback voltage VFB. Through a trimming mode, the up codes UP_CODE[N:1] and the down codes DN_CODE[N:1] adjusted by the code generator 120 may be a plurality of final trimming codes.

In detail, as the up codes UP_CODE[N:1] increase, the feedback voltage VFB may also be increased, and as the down codes DN_CODE[N:1] decrease, the feedback voltage VFB may also be decreased. The amount of increment in the feedback voltage VFB for each of the up codes UP_CODE[N:1] may be different. The amount of decrement in the feedback voltage VFB for each of the down codes DN_CODE[N:1] may be different. The increment of the feedback voltage VFB may be the largest when the most significant bit of the up code UP_CODE[N] is changed, and the increment of the feedback voltage VFB may be the smallest when the least significant bit of the up code UP_CODE[1] is changed. Similarly, the decrement of the feedback voltage VFB by the down code DN_CODE[N] that is the most significant bit may be the largest, and the decrement of the feedback voltage VFB by the down code DN_CODE[1] that is the least significant bit may be the smallest.

In an embodiment, with regard to the feedback voltage VFB, the code generator 120 may adjust the up codes UP_CODE[N:1] in order from the most significant bit to the least significant bit and may adjust the down codes DN_CODE[N:1] in order from the most significant bit to the least significant bit. An operation of the code generator 120 will be more fully described with reference to FIGS. 2 to 5.

The nonvolatile storage device 130 may store the up codes UP_CODE[N:1] and the down codes DN_CODE[N:1] that are adjusted by the code generator 120 wherein the feedback voltage VFB is set to the reference voltage VREF. Because the nonvolatile storage device 130 stores a trimming result of the feedback voltage VFB, the value of feedback voltage VFB may be maintained after a power down of a system including the nonvolatile storage device, and may be reused instantly after power up of the system.

After trimming, the nonvolatile storage device 130 may provide the stored up codes UP_CODE[N:1] and the stored down codes DN_CODE[N:1] to the voltage generator 150 through the switch circuit 140.

In an embodiment, the nonvolatile storage device 130 may include an anti-fuse array. An anti-fuse may be changed from a high resistance state to a low resistance state by an electrical programming. In another embodiment, the nonvolatile storage device 130 may include any one of a NAND flash memory, a NOR flash memory, a magnetic random access memory (MRAM), a phase-change random access memory (PRAM), a resistive random access memory (RRAM), a ferroelectric random access memory (FRAM), and a thyristor random access memory (TRAM).

The switch circuit 140 may select the up codes UP_CODE[N:1] and the down codes DN_CODE[N:1] adjusted by the code generator 120 or the up codes UP_CODE[N:1] and the down codes DN_CODE[N:1] stored in the nonvolatile storage device 130 and may provide the selected codes to the voltage generator 150. The switch circuit 140 may select the up codes UP_CODE[N:1] and the down codes DN_CODE[N:1] of the code generator 120 while the feedback voltage VFB is being adjusted (i.e., in the trimming mode). In this case, the up codes UP_CODE[N:1] and the down codes DN_CODE[N:1] from the code generator 120 may be continuously changed until the feedback voltage VFB is set to the reference voltage VREF (refer to FIGS. 2 and 3 to be described later).

After the trimming mode, the switch circuit 140 may select the up codes UP_CODE[N:1] and the down codes DN_CODE[N:1] stored in the nonvolatile storage device 130. In this case, the up codes UP_CODE[N:1] and the down codes DN_CODE[N:1] may have a specific value. In an embodiment, the switch circuit 140 may perform a multiplexer function.

The voltage generator 150 may generate the feedback voltage VFB based on a plurality of trimming codes selected by the switch circuit 140. In the trimming mode, the voltage generator 150 may adjust the feedback voltage VFB based on the plurality of trimming codes which are being changed. After the trimming mode, the voltage generator 150 may generate the feedback voltage VFB similar to the reference voltage VREF, based on the plurality of trimming codes of the specific value stored in the nonvolatile storage device 130. A structure of the voltage generator 150 will be more fully described with reference to FIG. 7.

Figure 2:
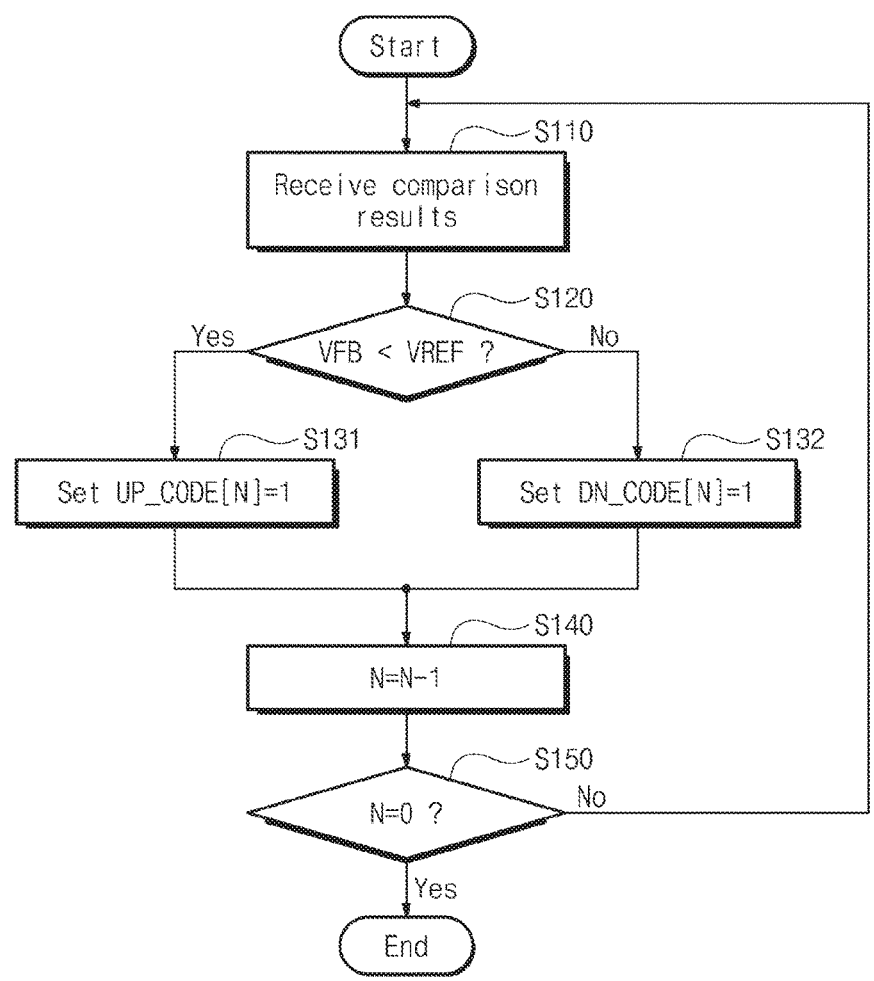
FIG. 2 is a view illustrating a flowchart of a trimming operation of a code generator illustrated in FIG. 1.

FIG. 2 is a flowchart illustrating a trimming operation of a code generator illustrated in FIG. 1. FIG. 2 will be described with reference to FIG. 1. In FIG. 2, it is assumed that an initial value of the up codes UP_CODE[N:1] and the down codes DN_CODE[N:1] are "0000000$_b$," respectively.

In operation S110, the code generator 120 may receive the comparison result COMP from the comparator 110.

In operation S120, the code generator 120 determines if the feedback voltage VFB is less than the reference voltage VREF. If the feedback voltage VFB is less than the reference voltage VREF in operation S120 (Yes), the code generator 120 may perform operation S131. If the feedback voltage VFB is greater than the reference voltage VREF (No) in operation S120, the code generator 120 may perform operation S132.

If the feedback voltage VFB is less than the reference voltage VREF, in operation S131 the code generator 120 may set the up code UP_CODE[N] to "1". If the feedback voltage VFB is greater than the reference voltage VREF, in operation S132 the code generator 120 may set the down code DN_CODE[N] to "1".

Since the N-th up code UP_CODE[N] or the N-th down code DN_CODE[N] is set in operation S131 or operation S132, in operation S140, the code generator 120 may prepare for setting the (N-1)-th up code UP_CODE[N-1] or the (N-1)-th down code DN_CODE[N-1].

In operation S150, the code generator 120 may determine whether the up codes UP_CODE[N:1] or the down codes DN_CODE[N:1] are all used (i.e., N="0"). If it is determined that the up codes UP_CODE[N:1] or the down codes DN_CODE[N:1] are all used (Yes), the trimming operation may end after the up codes UP_CODE[N:1] and the down codes DN_CODE[N:1] are stored in the nonvolatile storage device 130. If it is determined that the up codes UP_CODE[N:1] or the down codes DN_CODE[N:1] are not all used in operation S150 (No), the trimming operation may be repeated. That is, the code generator 120 may repeatedly perform operation S110 to operation S150.

The flowchart of the code generator 120 illustrated in FIG. 2 may refer to the case where the code generator 120 operates depending on a binary search algorithm or the case where the code generator 120 operates to be similar to a successive approximation analog to digital converter (SAR ADC). A timing diagram of the code generator 120 according to the flowchart of FIG. 2 will be described below.

Figure 3:
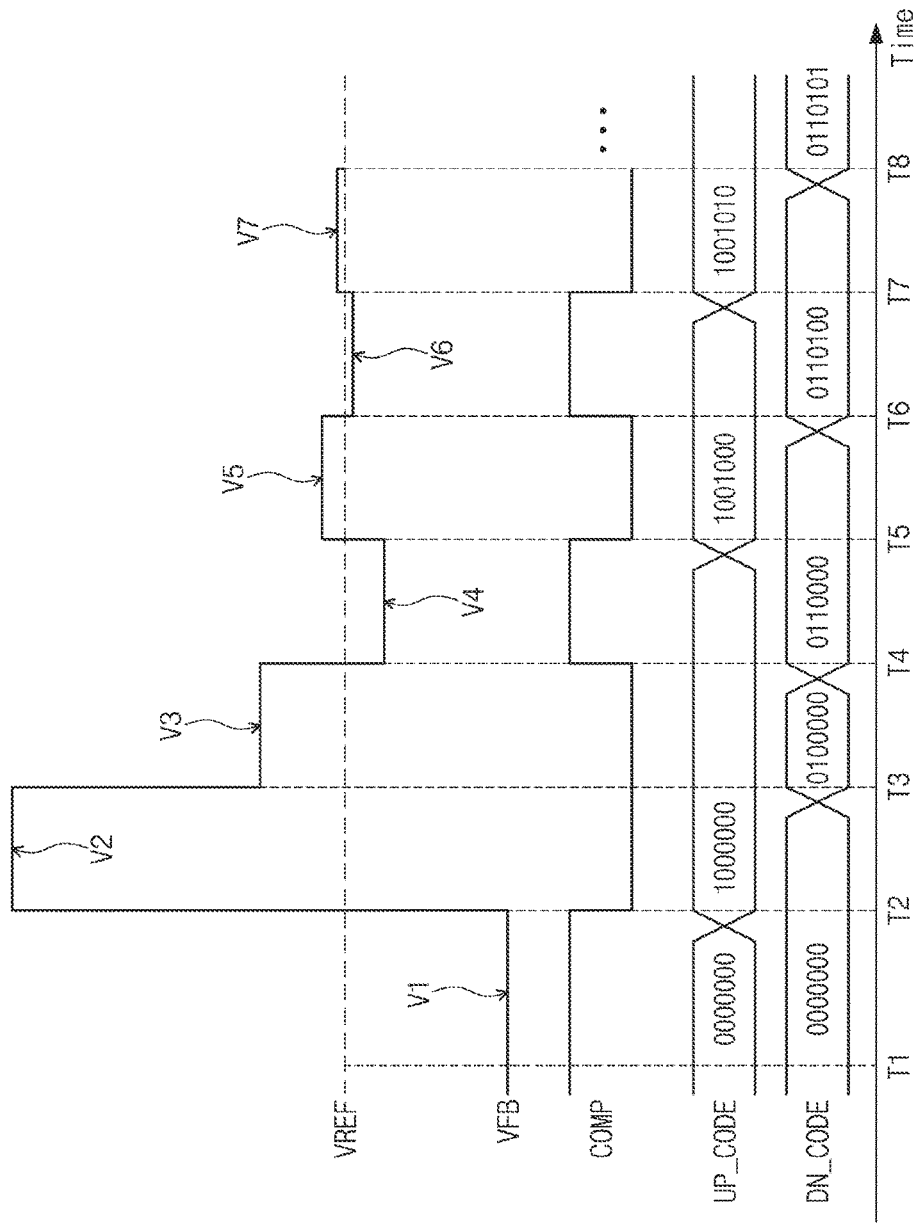
FIG. 3 is a view illustrating a timing diagram of the code generator illustrated in FIG. 1.

FIG. 3 is a view illustrating a timing diagram of a code generator illustrated in FIG. 1. FIG. 3 will be described with reference to FIGS. 1 and 2. In FIG. 3, a horizontal axis indicates time. It is assumed that "N" of each of the up codes UP_CODE[N:1] and the down codes DN_CODE[N:1] is "7". Also, it is assumed that each of the increments of the up codes UP_CODE[N:1] to increase the feedback voltage VFB is proportional to $2^N$, and similarly, it is assumed that each of the decrements of the down codes DN_CODE[N:1] to decrease the feedback voltage VFB is proportional to $2^N$.

From a point of time T1 to a point of time T2, an initial voltage level of the feedback voltage VFB is a first voltage level V1. The feedback voltage VFB is less than the reference voltage VREF. Accordingly, the comparison result COMP of the comparator 110 may be high. The code generator 120 may adjust the up codes UP_CODE[7:1] to increase the feedback voltage VFB. The code generator 120 may first control the up code UP_CODE[7] which is the most significant bit. As described above, the increment of the up code UP_CODE[7] is the largest. Before the point of time T2, the code generator 120 may set the MSB up code UP_CODE[7], from among the up codes UP_CODE[7:1], to "1" (operation S131). The feedback voltage VFB may increase from the first voltage level V1 to a second voltage level V2.

From the point of time T2 to a point of time T3, the feedback voltage VFB may be greater than the reference voltage VREF by the adjustment of the code generator 120. Accordingly, the comparison result COMP of the comparator 110 may be low. The code generator 120 may adjust the down codes DN_CODE[7:1] to decrease the feedback voltage VFB. In this case, if the MSB down code DN_CODE[7] is set to "1", the feedback voltage VFB may return to a voltage level that is similar to the first voltage level V1 between the point of time T1 and the point of time T2. For this reason, the code generator 120 may set not the MSB down code DN_CODE[7] but the down code DN_CODE[6] to "1" (operation S132). The feedback voltage VFB may decrease from the second voltage level V2 to a third voltage level V3.

From the point of time T3 to a point of time T4, the feedback voltage VFB may be still greater than the reference voltage VREF in spite of the adjustment of the code generator 120. Accordingly, the comparison result COMP of the comparator 110 may continue to be low. The code generator 120 may again adjust the down codes DN_CODE[7:1] to decrease the feedback voltage VFB. In an embodiment, the code generator 120 may set the down code DN_CODE[5] to "1" (operation S132). The feedback voltage VFB may decrease from the third voltage level V3 to a fourth voltage level V4.

From the point of time T4 to a point of time T5, the feedback voltage VFB may be less than the reference voltage VREF by the adjustment of the code generator 120. Accordingly, the comparison result COMP of the comparator 110 may be high. The code generator 120 may again adjust the up codes UP_CODE[7:1] to increase the feedback voltage VFB. In an embodiment, the code generator 120 may set the up code UP_CODE[4] to "1" (operation S131). The feedback voltage VFB may increase from the fourth voltage level V4 to a fifth voltage level V5.

From the point of time T5 to a point of time T6, the feedback voltage VFB may be greater than the reference voltage VREF by the adjustment of the code generator 120. Accordingly, the comparison result COMP of the comparator 110 may be low. The code generator 120 may again adjust the down codes DN_CODE[7:1] to decrease the feedback voltage VFB. In an embodiment, the code generator 120 may set the down code DN_CODE[3] to "1" (operation S132). The feedback voltage VFB may decrease from the fifth voltage level V5 to a sixth voltage level V6.

From the point of time T6 to a point of time T7, the feedback voltage VFB may be less than the reference voltage VREF by the adjustment of the code generator 120. Accordingly, the comparison result COMP of the comparator 110 may be high. The code generator 120 may again adjust the up codes UP_CODE[7:1] to increase the feedback voltage VFB. In an embodiment, the code generator 120 may set the up code UP_CODE[2] to "1" (operation S131). The feedback voltage VFB may increase from the sixth voltage level V6 to a seventh voltage level V7.

From the point of time T7 to a point of time T8, the feedback voltage VFB may be greater than the reference voltage VREF by the adjustment of the code generator 120. Accordingly, the comparison result COMP of the comparator 110 may be low. The code generator 120 may again adjust the down codes DN_CODE[7:1] to decrease the feedback voltage VFB. In an embodiment, the code generator 120 may set the down code DN_CODE[1] to "1" (operation S132). The feedback voltage VFB may decrease from the seventh voltage level V7 to a reference voltage level.

The code generator 120 may adjust the up codes UP_CODE[7:1] and the down codes DN_CODE[7:1] from the point of time T1 to the point of time T8. After the point of time T8, the up codes UP_CODE[7:1] of "1001010$_b$" and the down codes DN_CODE[7:1] of "0110101$_b$" may be stored in the nonvolatile storage device 130.

As described above, the nonvolatile storage device 130 may include an anti-fuse array. The up codes UP_CODE[7:1] and the down codes DN_CODE[7:1] may be programmed in the anti-fuse array. Here, the program operation may include a rupture operation in which an anti-fuse is changed from a high resistance state to a low resistance state.

In detail, anti-fuses corresponding to codes, each of which has "1", from among the up codes UP_CODE[7:1] and the down codes DN_CODE[7:1] may be ruptured, and anti-fuses corresponding to codes, each of which has "0", from among the up codes UP_CODE[7:1] and the down codes DN_CODE[7:1] may not be ruptured. After the point of in time T8, seven anti-fuses corresponding to up codes UP_CODE[7], UP_CODE[4], and UP_CODE[2] and down codes DN_CODE[6], DN_CODE[5], DN_CODE[3], and DN_CODE[1] may be ruptured to program the up codes UP_CODE[7:1] of "1001010$_b$," and the down codes DN_CODE[7:1] of "0110101$_b$" in the anti-fuse array. Below, an operation of the code generator 120 to reduce the number of ruptured anti-fuses will be described with reference to FIGS. 4 and 5.

Figure 4:
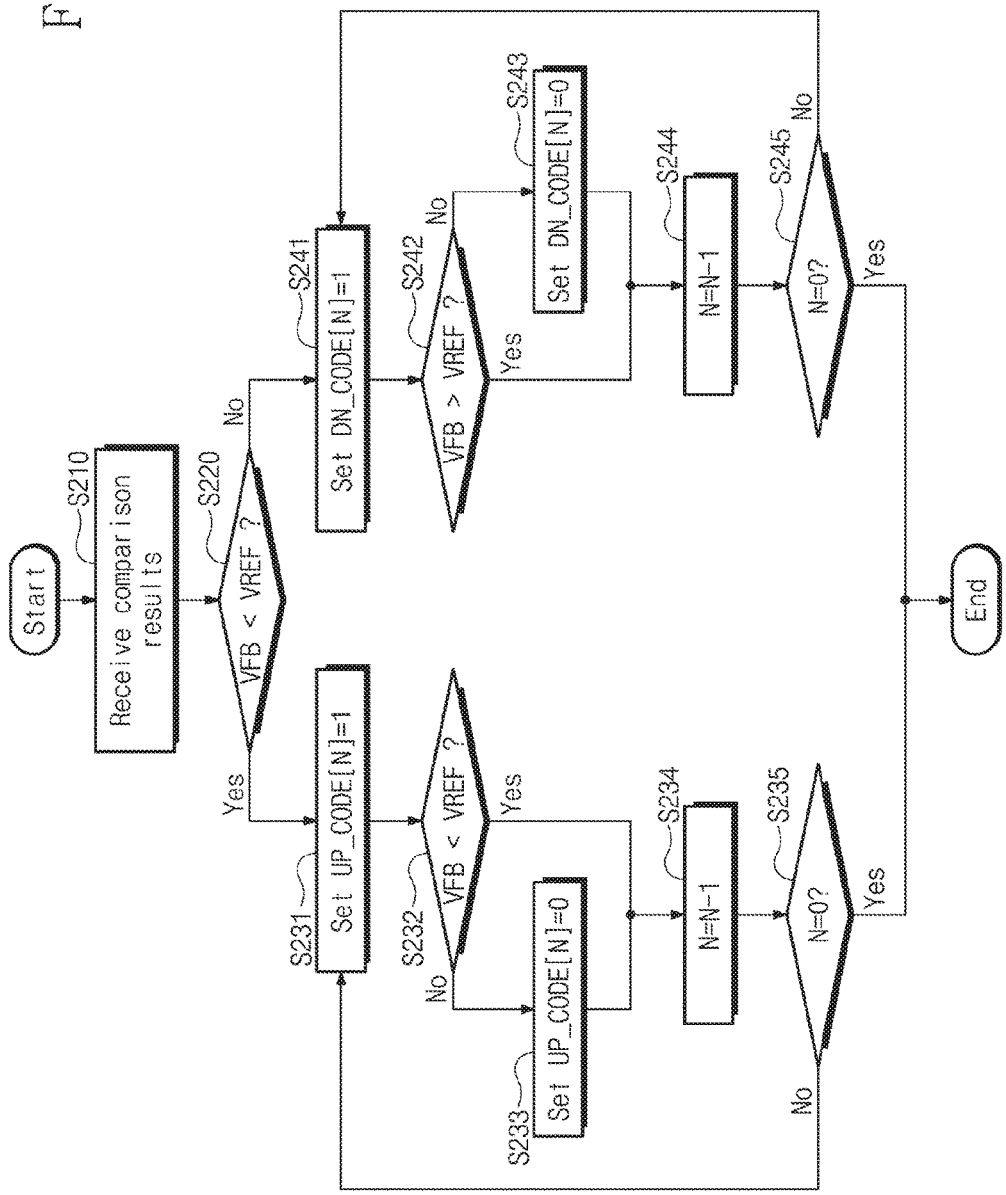
FIG. 4 is a view illustrating a flowchart of a trimming operation of a code generator illustrated in FIG. 1.

FIG. 4 is a flowchart illustrating trimming operation of a code generator illustrated in FIG. 1. FIG. 4 will be described with reference to FIG. 1. In FIG. 4, it is assumed that an initial value of each of the up codes UP_CODE[N:1] and the down codes DN_CODE[N:1] is "0000000$_b$".

In operation S210, the code generator 120 may receive the comparison result COMP from the comparator 110.

In operation S220, the code generator 120 determines if the feedback voltage VFB is less than the reference voltage VREF. If the feedback voltage VFB is less than the reference voltage VREF in operation S220 (Yes), the code generator 120 may perform operation S231. If the feedback voltage VFB is greater than the reference voltage VREF in operation S220 (No), the code generator 120 may perform operation S241.

In operation S231, the code generator 120 may set the up code UP_CODE[N] to "1". If the feedback voltage VFB is less than the reference voltage VREF in operation S232 (Yes), a value of the up code UP_CODE[N] set in operation S231 may be maintained at "1" without change. However, in the case where the feedback voltage VFB is greater than the reference voltage VREF in operation S232 (No), in operation S233 the code generator 120 may set the up code UP_CODE[N] to "0". That is, after adjusting one of the up codes UP_CODE[N:1] in operation S231, the code generator 120 may change a value of an adjusted up code into a value (e.g., an initial value of "0") before the adjustment if the feedback voltage VFB is greater than the reference voltage VREF.

Since the N-th up code UP_CODE[N] is set in operation S231 and operation S233, in operation S234 the code generator 120 may prepare for setting the (N−1)-th up code UP_CODE[N−1].

In operation S235, the code generator 120 may determine whether the up codes UP_CODE[N:1] are all used (i.e., N="0"). If it is determined that the up codes UP_CODE[N:1] are all used (Yes), the trimming operation may end after the up codes UP_CODE[N:1] and the down codes DN_CODE[N:1] are stored in the nonvolatile storage device 130. If it is determined that at least one of the up codes UP_CODE[N:1] are not used (No), the trimming operation may be repeated. That is, the code generator 120 may repeatedly perform operation S231 to operation S235.

In operation S241, the code generator 120 may set the down code DN_CODE[N] to "1". If the feedback voltage VFB is greater than the reference voltage VREF in operation S242 (Yes), a value of the down code DN_CODE[N] set in operation S241 may be maintained at "1" without change. However, in the case where the feedback voltage VFB is less than the reference voltage VREF in operation S241 (No), in operation S243 the code generator 120 may set the down code DN_CODE[N] to "0". That is, after adjusting one of the down codes DN_CODE[N:1] in operation S241, the code generator 120 may change a value of an adjusted down code into a value (e.g., an initial value of "0") which may be a value before the adjustment made if the feedback voltage VFB is less than the reference voltage VREF.

Since the N-th down code DN_CODE[N] is set in operation S241 and operation S243, in operation S244 the code generator 120 may prepare for setting the (N−1)-th down code DN_CODE[N−1].

In operation S245, the code generator 120 may determine whether the down codes DN_CODE[N:1] are all used (i.e., N="0"). If it is determined that the down codes DN_CODE[N:1] are all used (Yes), the trimming operation may end after the up codes UP_CODE[N:1] and the down codes DN_CODE[N:1] are stored in the nonvolatile storage device 130. If it is determined in operation S245 that at least one of the down codes DN_CODE[N:1] is not used (No), the trimming operation may be repeated. That is, the code generator 120 may repeatedly perform operation S241 to operation S245.

The flowchart of FIG. 4 may refer to the case where the code generator 120 operates depending on a minimum fusing algorithm according to an embodiment of the inventive concept. The code generator 120 may adjust the up codes UP_CODE[N:1] if the feedback voltage VFB is less than the reference voltage VREF and may maintain an initial value of the down codes DN_CODE[N:1] such that anti-fuses corresponding to the down-down codes DN_CODE[N:1] are not ruptured. The code generator 120 may adjust the down codes DN_CODE[N:1] if the feedback voltage VFB is greater than the reference voltage VREF and may maintain an initial value of the up codes UP_CODE[N:1] such that anti-fuses corresponding to the up codes UP_CODE[N:1] are not ruptured. A timing diagram of the code generator 120 according to the flowchart of FIG. 4 will be described below.

Figure 5:
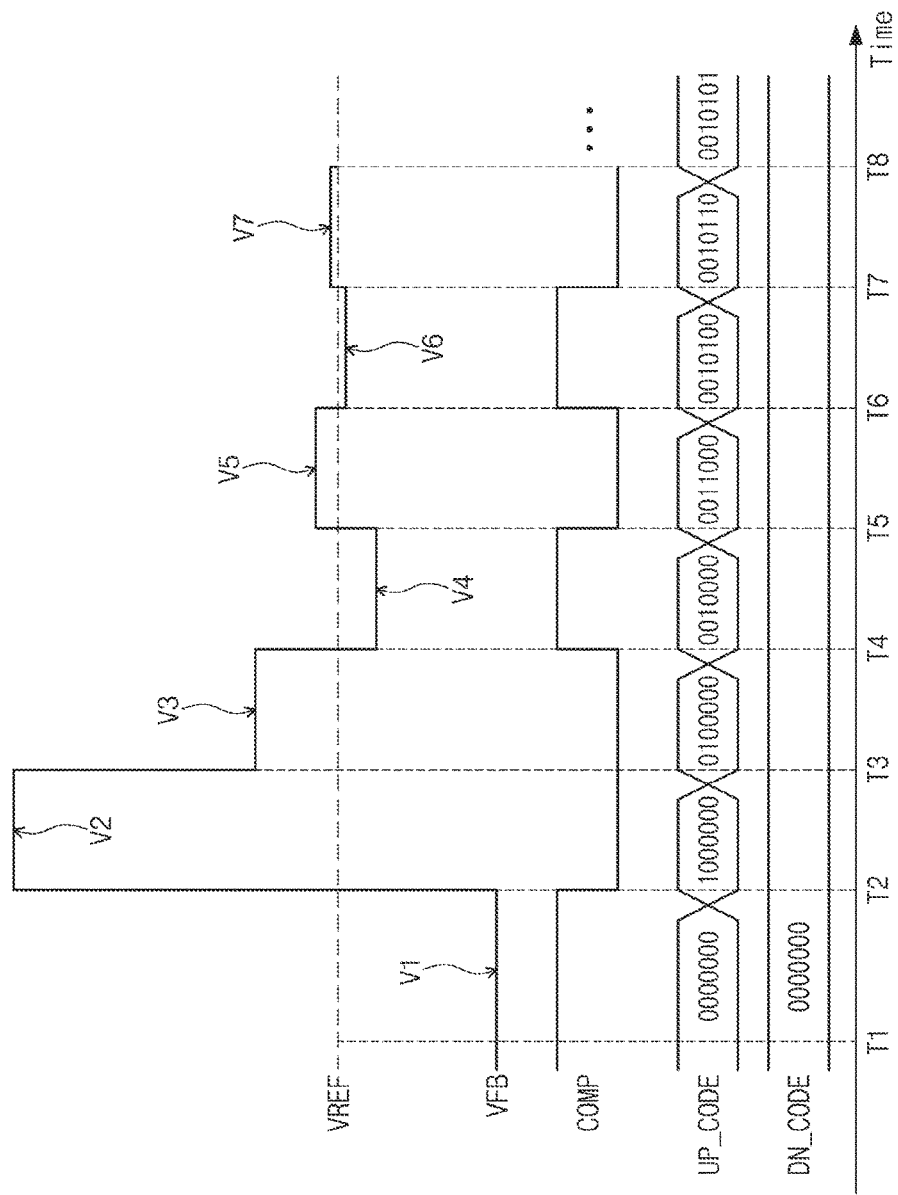
FIG. 5 is a view illustrating a timing diagram of the code generator illustrated in FIG. 1.

FIG. 5 is a view illustrating a timing diagram of a code generator illustrated in FIG. 1. FIG. 5 will be described with reference to FIGS. 1 and 4. Here, a horizontal axis indicates time. It is assumed that "N" of each of the up codes UP_CODE[N:1] and the down codes DN_CODE[N:1] is "7". Also, it is assumed that each of the increments of the up codes UP_CODE[N:1] to increase the feedback voltage VFB is proportional to $2^N$, and similarly, it is assumed that each of the decrements of the down codes DN_CODE[N:1] to decrease the feedback voltage VFB is proportional to $2^N$.

From a point of time T1 to a point of time T2, an initial voltage level of the feedback voltage VFB is a first voltage level V1. The feedback voltage VFB is less than the reference voltage VREF. Accordingly, the comparison result COMP of the comparator 110 may be high. The code generator 120 may set the MSB up code UP_CODE[7] corresponding to the most significant bit to "1" (operation S231). The feedback voltage VFB may increase from the first voltage level V1 to the second voltage level V2.

From the point of time T2 to a point of time T3, the feedback voltage VFB may be greater than the reference voltage VREF by the adjustment of the code generator 120. Accordingly, the comparison result COMP of the comparator 110 may be low. Instead of adjusting the down codes DN_CODE[7:1], the code generator 120 may set the previously adjusted up code UP_CODE[7] to "0" (operation S233) and may set the next up code UP_CODE[6] to "1", (operation S234, operation S235, and operation S231). The feedback voltage VFB may directly decrease from the second voltage level V2 to the third voltage level V3 or may increase to the third voltage level V3 after being reset to the first voltage level V1.

From the point of time T3 to the point of time T4, the feedback voltage VFB may be still greater than the reference voltage VREF. Accordingly, the comparison result COMP of the comparator 110 may be low. Instead of adjusting the down codes DN_CODE[7:1], the code generator 120 may set the previously adjusted up code UP_CODE[6] to "0" (operation S233) and may set the next up code UP_CODE[5] to "1" (operation S234, operation S235, and operation S231). The feedback voltage VFB may directly decrease from the third voltage level V3 to the fourth voltage level V4 or may increase to the fourth voltage level V4 after being reset to the first voltage level V1.

From the point of time T4 to a point of time T5, the feedback voltage VFB may be less than the reference voltage VREF by the adjustment of the code generator 120. Accordingly, the comparison result COMP of the comparator 110 may be high. The code generator 120 may maintain the previously adjusted up code UP_CODE[5] at "1" and may set the next up code UP_CODE[4] to "1" (operation S234, operation S235, and operation S231). The feedback voltage VFB may increase from the fourth voltage level V4 to the fifth voltage level V5.

From the point of time T5 to the point of time T6, the feedback voltage VFB may be greater than the reference voltage VREF by the adjustment of the code generator 120. Accordingly, the comparison result COMP of the comparator 110 may be low. Instead of adjusting the down codes DN_CODE[7:1], the code generator 120 may set the previously adjusted up code UP_CODE[4] to "0" (operation S233) and may set the next up code UP_CODE[3] to "1" (operation S234, operation S235, and operation S231). The feedback voltage VFB may directly decrease from the fifth voltage level V5 to the sixth voltage level V6 or may increase to the sixth voltage level V6 after being reset to the fourth voltage level V4.

From the point of time T6 to the point of time T7, the feedback voltage VFB may be less than the reference voltage VREF by the adjustment of the code generator 120. Accordingly, the comparison result COMP of the comparator 110 may be high. The code generator 120 may maintain the previously adjusted up code UP_CODE[3] at "1" and may set the next up code UP_CODE[2] to "1" (operation S234, operation S235, and operation S231). The feedback voltage VFB may increase from the sixth voltage level V6 to the seventh voltage level V7.

From the point of time T7 to a point of time T8, the feedback voltage VFB may be greater than the reference voltage VREF by the adjustment of the code generator 120. Accordingly, the comparison result COMP of the comparator 110 may be low. Instead of adjusting the down codes DN_CODE[7:1], the code generator 120 may set the previously adjusted up code UP_CODE[2] to "0" (operation S233) and may set the next up code UP_CODE[1] to "1" (operation S234, operation S235, and operation S231). The feedback voltage VFB may directly decrease from the seventh voltage level V7 to the reference voltage level or may increase to the reference voltage level after being reset to the sixth voltage level V6.

The code generator 120 may adjust only the up codes UP_CODE[7:1] from the point of time T1 to the point of time T8. After the point of time T8, the up codes UP_CODE [7:1] of "0010101$_b$" and the down codes DN_CODE[7:1] of "0000000$_b$" may be stored in the nonvolatile storage device 130. Three anti-fuses corresponding to the up codes UP_CODE[5], UP_CODE[3], and UP_CODE[1] may be ruptured by the trimming operation of FIG. 5. If the code generator 120 operates depending on the minimal fusing algorithm instead of the binary search algorithm, the number of anti-fuses to be ruptured may be reduced.

In FIGS. 2 to 5, an initial value of the up codes UP_CODE [N:1] or the down codes DN_CODE[N:1] is "0000000$_b$". If the code generator 120 adjust the up codes UP_CODE[N:1] or the down codes DN_CODE[N:1], anti-fuses corresponding to codes, each of which has "1", from among the up codes UP_CODE[7:1] and the down codes DN_CODE[7:1] may be ruptured. However, the above-described values correspond to an example. In another embodiment, an initial value of the up codes UP_CODE[7:1] or the down codes DN_CODE[7:1] may be "1111111$_b$". In this case, anti-fuses corresponding to codes, each of which has "0", from among the up codes UP_CODE[7:1] and the down codes DN_CODE[7:1] may be ruptured.

As described above, the code generator 120 may adjust only some ones of the up codes UP_CODE[N:1] or the down codes DN_CODE[N:1] and may maintain the others at an initial value. If the up codes UP_CODE[N:1] or the down codes DN_CODE[N:1] remain at an initial value, the corresponding anti-fuses may not be ruptured.

The number of anti-fuses ruptured when the code generator 120 operates depending on the minimal fusing algorithm may be smaller than the number of anti-fuses ruptured when the code generator 120 operates depending on the binary search algorithm. Accordingly, a time taken to program the anti-fuse array may be reduced. Also, if the code generator 120 operates depending on the minimal fusing algorithm, the voltage trimming circuit 100 may again perform the trimming operation even after the trimming operation is performed.

According to an embodiment, if the voltage trimming circuit 100 has been previously used for adjusting the feedback voltage VFB by trimming the up codes UP_CODE [N:1], the voltage trimming circuit 100 may readjust the feedback voltage VFB by using codes which are not previously used. The previously not used codes may be accessed by selecting anti-fuses which are not ruptured for adjusting the feedback voltage included in the up codes UP_CODE

[N:1], or the down codes DN_CODE[N:1]. Similarly, if the voltage trimming circuit 100 previously adjusts the feedback voltage VFB by using the down codes DN_CODE[N:1], the voltage trimming circuit 100 may readjust the feedback voltage VFB by using any codes which are not previously used. The previously not used codes may be accessed by selecting anti-fuses which are not ruptured for adjusting the feedback voltage included in UP_CODE[N:1], or the down codes DN_CODE[N:1].

Figure 6:
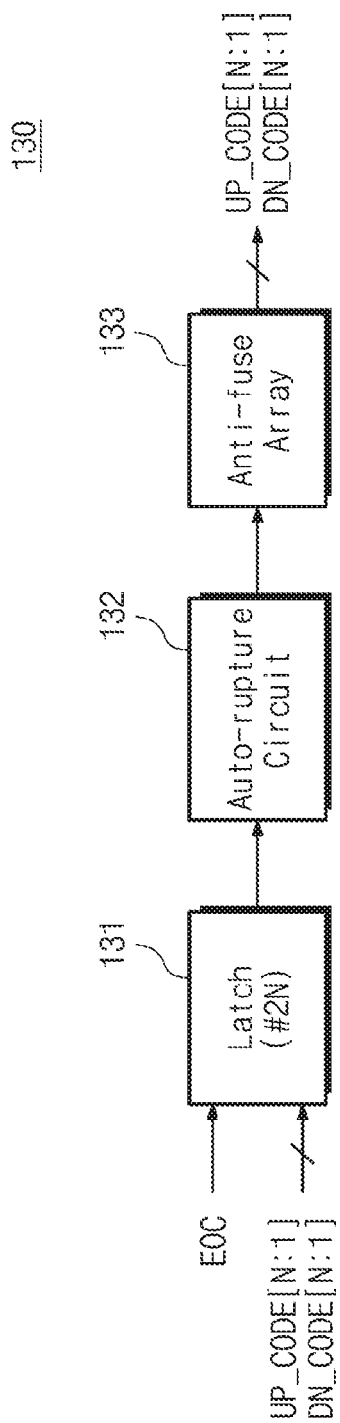
FIG. 6 is block diagram illustrating nonvolatile storage device illustrated in FIG. 1.

FIG. 6 is block diagram illustrating nonvolatile storage device illustrated in FIG. 1. Referring to FIG. 6, the nonvolatile storage device 130 may include a plurality of latches 131, an auto-rupture circuit 132, and an anti-fuse array 133.

If the operation of the code generator 120 of FIG. 1 is completed, the plurality of latches 131 may store the up codes UP_CODE[N:1] and the down codes DN_CODE[N:1]. To this end, the plurality of latches 131 may receive an end of conversion (EOC) signal from the code generator 120 of FIG. 1. The code generator 120 may generate the end of conversion signal after generating the up codes UP_CODE[N:1] and the down codes DN_CODE[N:1]. The number of the latches 131 may be "2N" that corresponds to a sum of the number of the up codes UP_CODE[N:1] and the number of the down codes DN_CODE[N:1].

The auto-rupture circuit 132 may rupture anti-fuses of the anti-fuse array 133, which respectively correspond to the up codes UP_CODE[N:1] and the down codes DN_CODE[N:1] latched in the plurality of latches 131. In detail, the auto-rupture circuit 132 may apply a high voltage to the corresponding anti-fuses.

The anti-fuse array 133 may include a plurality of anti-fuses (not illustrated) located at intersections of at least one or more rows (not illustrated) and at least one or more columns (not illustrated). The plurality of anti-fuses may be respectively ruptured by a plurality of trimming codes (i.e., the up codes UP_CODE[N:1] and the down codes DN_CODE[N:1]) to adjust the feedback voltage VFB. The anti-fuse array 133 may provide the switch circuit 140 of FIG. 1 with the programmed up codes UP_CODE[N:1] and the programmed down codes DN_CODE[N:1].

Figure 7:
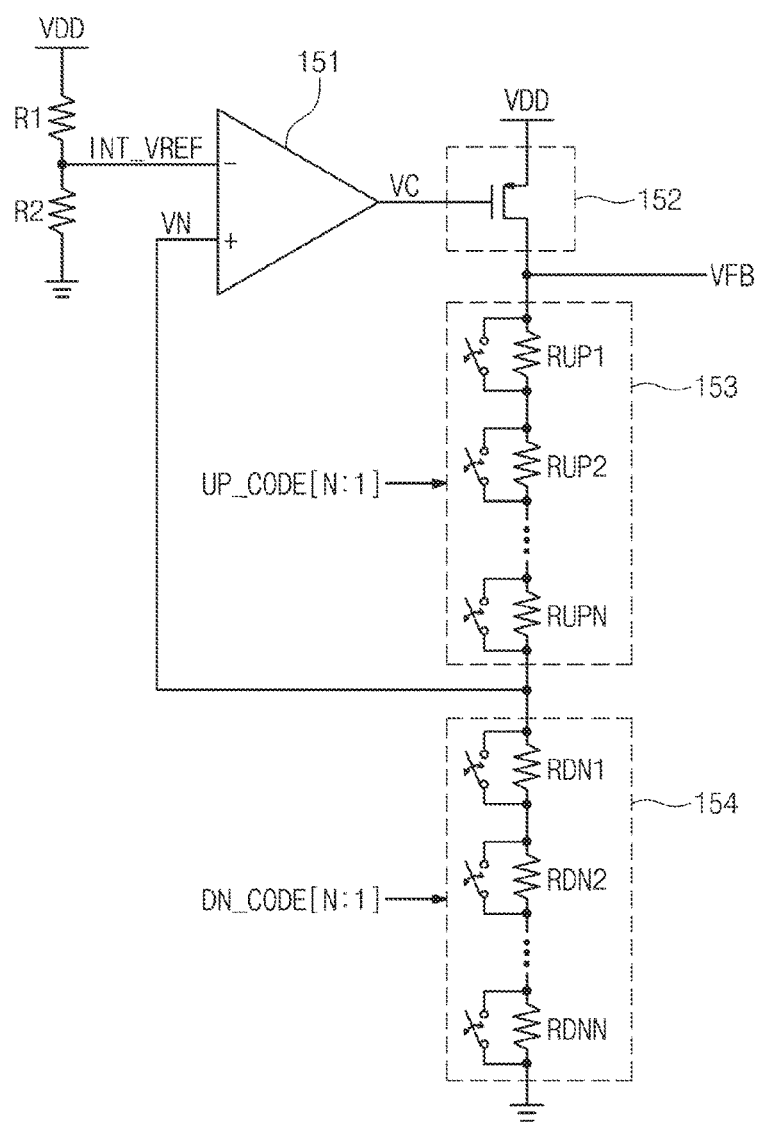
FIG. 7 is a view illustrating a structure of a voltage generator illustrated in FIG. 1.

FIG. 7 is a view illustrating a structure of a voltage generator illustrated in FIG. 1. Referring to FIG. 7, the voltage generator 150 may include a first resistor R1, a second resistor R2, a comparator 151, a driver 152, an up resistor string 153, and a down resistor string 154.

The first resistor R1 and the second resistor R2 may generate an internal reference voltage INT_VREF. Here, the reference voltage INT_VREF may be calculated by (VDD×(R2/(R1+R2))). Here, "VDD" means a power supply voltage.

The comparator 151 may receive the internal reference voltage INT_VREF and a node voltage VN. In detail, the comparator 151 may receive the internal reference voltage INT_VREF through an inverting input terminal and may receive the node voltage VN through a non-inverting input terminal. The comparator 151 may compare the internal reference voltage INT_VREF and the node voltage VN and may output a comparison signal VC. In an embodiment, the comparator 151 may be an operational amplifier, and the comparison signal VC may be an analog signal.

The driver 152 may supply a current to the up resistor string 153, the down resistor string 154, and loads (not illustrated) connected to the feedback voltage VFB. The amount of current supplied from the driver 152 may be determined by the comparison signal VC. In an embodiment, the driver 152 may include a p-channel metal oxide semiconductor (PMOS). The driver 152 may stably control the feedback voltage VFB by adjusting the amount of current.

The up resistor string 153 may include resistors RUP1 to RUPN connected in series to each other, and the down resistor string 154 may include resistors RDN1 to RDNN connected in series to each other. A value of the up resistor string 153 may be determined by the up codes UP_CODE[N:1], and a value of the down resistor string 154 may be determined by the down codes DN_CODE[N:1].

The structure of the voltage generator 150 described with reference to FIG. 7 is only an example. Other structures that are able to increase the feedback voltage VFB in response to the up codes UP_CODE[N:1] and to decrease the feedback voltage VFB in response to the down codes DN_CODE[N:1] may be applied to the inventive concept.

Figure 8:
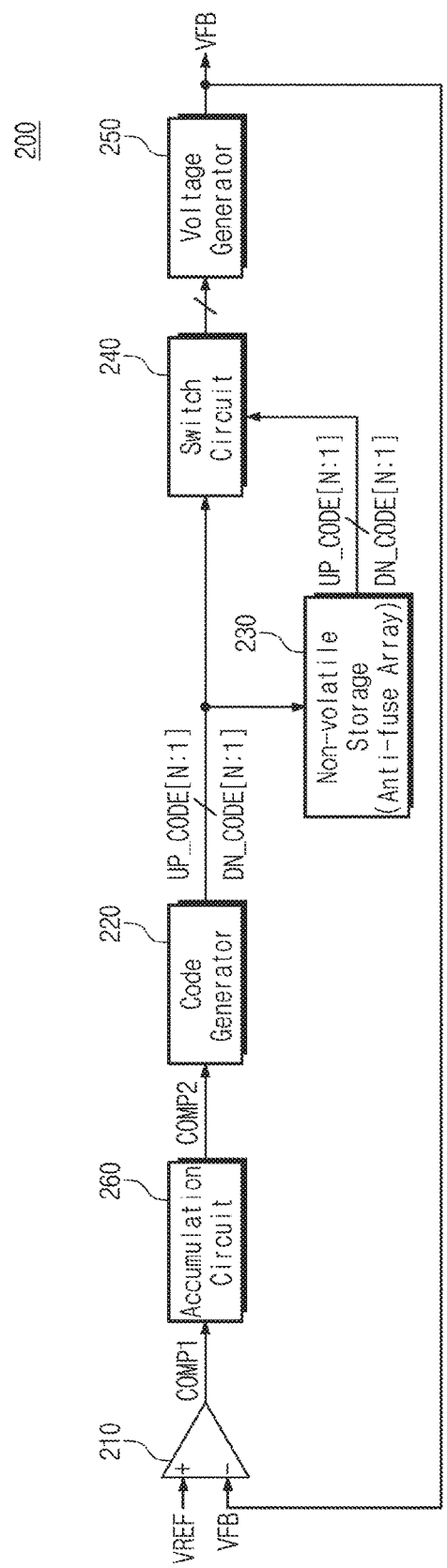
FIG. 8 is a block diagram illustrating a voltage trimming circuit according to another embodiment of the inventive concept.

FIG. 8 is a block diagram illustrating a voltage trimming circuit according to another embodiment of the inventive concept. Referring to FIG. 8, a voltage trimming circuit 200 may include a comparator 210, a code generator 220, a nonvolatile storage device 230, a switch circuit 240, a voltage generator 250, and an accumulation circuit 260. The voltage trimming circuit 200 of FIG. 8 may further include the accumulation circuit 260. If the voltage trimming circuit 200 includes the accumulation circuit 260, the code generator 220 may adjust the up codes UP_CODE[N:1] and the down codes DN_CODE[N:1] based on a comparison result COMP2 of the accumulation circuit 260 instead of the comparison result COMP1 of the comparator 210.

The accumulation circuit 260 may accumulate the comparison result COMP1 of the comparator 210. The accumulation circuit 260 may determine whether the feedback voltage VFB is greater than or less than the reference voltage VREF, based on the accumulated comparison result. Without the accumulation circuit 260, the comparator 210 may output an abnormal comparison result COMP1 due to noise that can be caused by variations in an operating voltage, inconstant power consumptions of peripheral circuits, etc. If the code generator 220 operates based on the abnormal comparison result COMP1, the feedback voltage VFB may not be set to the reference voltage VREF accurately. The accumulation circuit 260 may prevent the above-described issue. Below, an operation of the voltage trimming circuit 200 will be more fully described.

Figure 9:
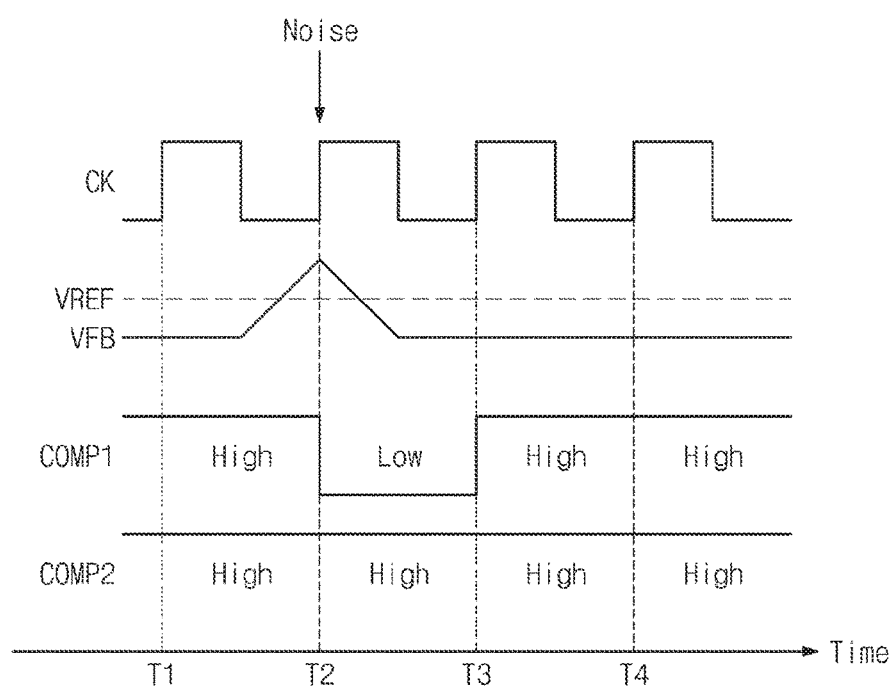
FIG. 9 is a view illustrating a timing diagram of an accumulation circuit illustrated in FIG. 8.

FIG. 9 is a timing diagram illustrating operation of the accumulation circuit shown in FIG. 8. In FIG. 9, a horizontal axis indicates time. It is assumed that the comparator 210 performs a comparison operation at a rising edge of a clock CK. In another embodiment, the comparator 210 may perform a comparison operation at a falling edge of the clock CK.

Since the feedback voltage VFB is less than the reference voltage VREF at points of time T1, T3, and T4, the comparator 210 may output the comparison result COMP1 corresponding to a high level. In contrast, at a point of time T2, the comparator 210 may output the abnormal comparison result COMP1 due to noise.

The accumulation circuit 260 may not transfer the comparison result COMP1 of the comparator 210 to the code generator 220 immediately, but it may accumulate the comparison result COMP1. In an embodiment, the accumulation circuit 260 may change the comparison result COMP2 of the accumulation circuit 260 after checking (i.e., confirming) that the comparison result COMP1 has the same value four times or more, for example. Accordingly, the abnormal comparison result COMP1 generated due to noise may not be transferred to the code generator 220 by the accumulation circuit 260.

Figure 10:
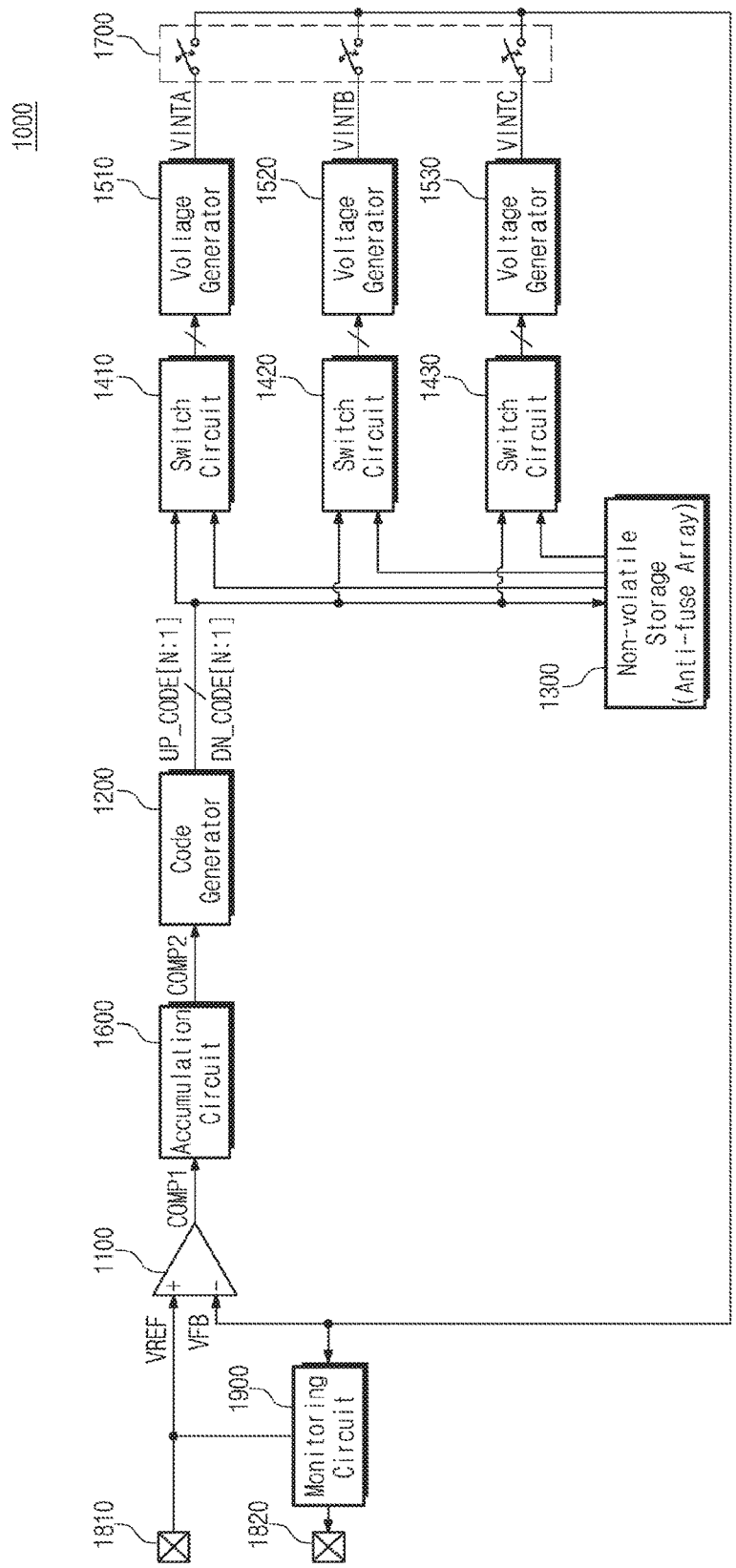
FIG. 10 is a block diagram illustrating an integrated circuit according to an embodiment of the inventive concept.

FIG. 10 is a block diagram illustrating an integrated circuit according to an embodiment of the inventive concept. An integrated circuit 1000 may include a comparator 1100, a code generator 1200, a nonvolatile storage device 1300, switch circuits 1410 to 1430, voltage generators 1510 to 1530, an accumulation circuit 1600, a switch circuit 1700, an input pad 1810, an output pad 1820, and a monitoring circuit 1900. Here, the comparator 1100, the code generator 1200, the nonvolatile storage device 1300, the switch circuits 1410 to 1430, the voltage generators 1510 to 1530, and the accumulation circuit 1600 may perform substantially the same functions as described with reference to FIGS. 1 and 8.

The integrated circuit 1000 may be various memory devices (e.g., a dynamic random access memory (DRAM), a static random access memory (SRAM), a NAND flash memory, a NOR flash memory, an MRAM, a PRAM, an RRAM, a FRAM, a TRAM, a solid state drive (SSD), a hard disk drive (HDD), etc.), a central processing unit (CPU), a graphics processing unit (GPU), an application specific integrated circuit (ASIC), a system on chip (SoC), etc. That is, the integrated circuit 1000 may generate at least one internal voltage by using a driving voltage. An embodiment is exemplified in FIG. 10 as the integrated circuit 1000 generates three internal voltages VINTA, VINTB, and VINTC. The integrated circuit 1000 may further include the switch circuits 1420 and 1430, the voltage generators 1520 and 1530, and the switch circuit 1700 in addition to the voltage trimming circuit 200 of FIG. 8. In FIG. 10, the number of internal voltages, the number of switch circuits 1410 to 1430, and the number of voltage generators 1510 to 1530 are only an example.

In an embodiment, the switch circuit 1700 may select the internal voltage VINTA as the feedback voltage VFB. If an operation of trimming the selected internal voltage VINTA is completed, the up codes UP_CODE[N:1] and the down codes DN_CODE[N:1] to adjust the internal voltage VINTA may be stored in the nonvolatile storage device 1300. Afterwards, the switch circuit 1700 may select the selected internal voltage VINTB as the feedback voltage VFB. If an operation of trimming the internal voltage VINTB is completed, the up codes UP_CODE[N:1] and the down codes DN_CODE[N:1] to adjust the internal voltage VINTB may be stored in the nonvolatile storage device 1300. The integrated circuit 1000 may trim the internal voltage VINTC in the same manner.

The input pad 1810 may receive the reference voltage VREF. The reference voltage VREF may have different values depending on the internal voltages VINTA, VINTB, and VINTC.

The output pad 1820 may be used to output the reference voltage VREF or the internal voltages VINTA, VINTB, and VINTC in the integrated circuit 1000 to the outside of the integrated circuit 1000. The monitoring circuit 1900 may select the reference voltage VREF or any one of the internal voltages VINTA, VINTB, and VINTC.

In an embodiment, an external test device (not illustrated) of the integrated circuit 1000 may receive the internal voltages VINTA, VINTB, and VINTC or the reference voltage VREF from the output pad 1820. The test device may monitor whether a level of the reference voltage VREF applied to the integrated circuit 1000 is appropriate or whether the adjusted internal voltages VINTA, VINTB, and VINTC are appropriate (monitoring).

Figure 11:
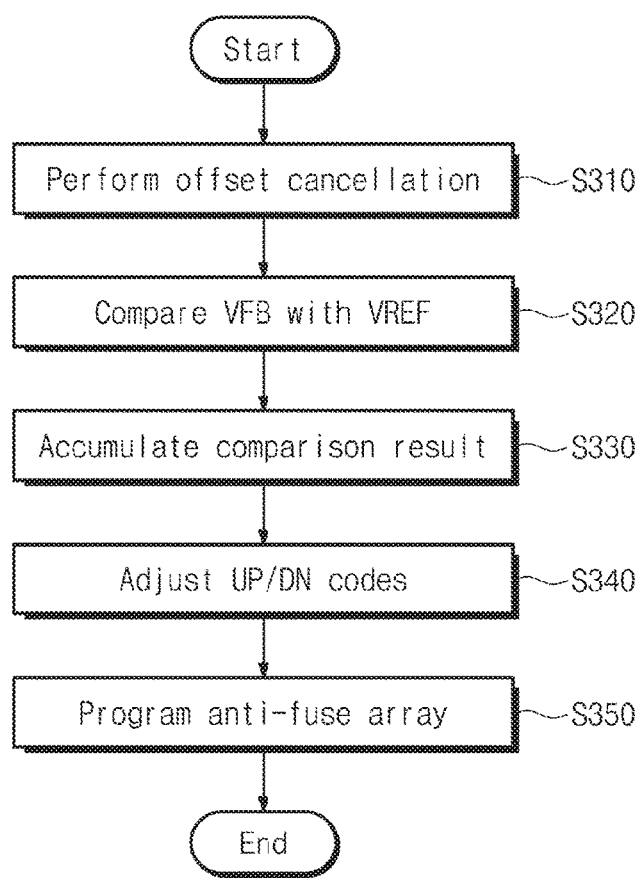
FIG. 11 is a view illustrating a flowchart associated with an operation of the voltage trimming circuit according to an embodiment of the inventive concept.

FIG. 11 is a view illustrating a flowchart associated with an operation of a voltage trimming circuit according to an embodiment of the inventive concept. FIG. 11 will be described with reference to FIG. 8.

In operation S310, an offset cancellation operation of the comparator 210 may be performed. If the offset cancellation operation is not performed, an error may occur during an operation of the comparator 210.

In operation S320, the comparator 210 may compare the feedback voltage VFB with the reference voltage VREF.

In operation S330, the accumulation circuit 260 may accumulate the comparison result COMP1 of the comparator 210. In operation S330, an abnormal comparison result of the comparator 210 due to noise may be removed. The accumulation circuit 260 may determine whether the feedback voltage VFB is greater than or less than the reference voltage VREF, based on the accumulated comparison result of the comparator 210.

In operation S340, the code generator 220 may adjust the up codes UP_CODE[N:1] and the down codes DN_CODE[N:1]. The code generator 220 may operate depending on the minimal fusing algorithm according to an embodiment of the inventive concept. In this case, an initial value of the down codes DN_CODE[N:1] may be maintained if the up codes UP_CODE[N:1] are adjusted; in contrast, an initial value of the up codes DN_CODE[N:1] may be maintained if the down codes DN_CODE[N:1] are adjusted. Here, anti-fuses corresponding to the up codes UP_CODE[N:1] maintained at the initial value or anti-fuses corresponding to the down codes DN_CODE[N:1] maintained at the initial value may not be ruptured in operation S350.

In operation S350, the nonvolatile storage device 230 may store the up codes UP_CODE[N:1] and the down codes DN_CODE[N:1]. In detail the nonvolatile storage device 230 may program an anti-fuse array depending on the up codes UP_CODE[N:1] and the down codes DN_CODE[N:1]. In detail, if anti-fuses corresponding to the up codes UP_CODE[N:1] are ruptured when the feedback voltage VFB is less than the reference voltage VREF, anti-fuses corresponding to the down codes DN_CODE[N:1] may not be ruptured. In contrast, if anti-fuses corresponding to the down codes DN_CODE[N:1] are ruptured when the feedback voltage VFB is greater than the reference voltage VREF, anti-fuses corresponding to the up codes UP_CODE[N:1] may not be ruptured.

Figure 12:
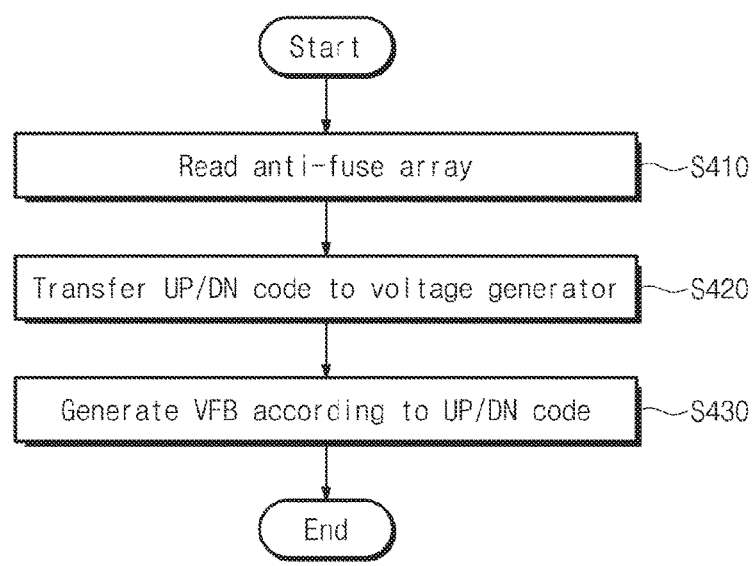
FIG. 12 is a view illustrating a flowchart associated with an operation of the trimming circuit after a trimming operation.

FIG. 12 is a view illustrating a flowchart associated with an operation of a voltage trimming circuit after a trimming operation. FIG. 12 will be described with reference to FIG. 8.

In operation S410, trimming information (i.e., the up codes UP_CODE[N:1] and the down codes DN_CODE[N:1]) may be read from an anti-fuse array.

In operation S420, the switch circuit 240 may transfer the up codes UP_CODE[N:1] and the down codes DN_CODE[N:1] read from the anti-fuse array to the voltage generator 250.

In operation S430, the voltage generator 250 may generate the feedback voltage VFB depending on the transferred up codes UP_CODE[N:1] and the transferred down codes DN_CODE[N:1].

A voltage trimming circuit and an operating method thereof according to an embodiment of the inventive concept may accurately adjust a feedback voltage to a reference voltage while using a small number of anti-fuses.

An integrated circuit according to an embodiment of the inventive concept may reduce a test time by reducing a time taken to trim an internal voltage.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A voltage trimming circuit comprising:
a comparator configured to compare a reference voltage with a feedback voltage;
a code generator configured to generate a plurality of trimming codes for trimming the feedback voltage based on a comparison result of the comparator, wherein when the comparison result indicates that the feedback voltage is to be increased, the code generator adjusts up codes of the plurality of trimming codes to increase the feedback voltage and maintains down codes of the plurality of trimming codes with an initial value, and wherein when the comparison result indicates that the feedback voltage is to be decreased, the code generator adjusts the down codes of the plurality of trimming codes and maintains the up codes with the initial value;
a nonvolatile storage device configured to store a plurality of final trimming codes adjusted by the code generator;
a switch circuit configured to select the plurality of trimming codes during a trimming mode and to select the plurality of final trimming codes after the trimming mode; and
a voltage generator configured to generate the feedback voltage based on the plurality of trimming codes selected by the switch circuit.

2. The voltage trimming circuit of claim 1, wherein an amount of increment in the feedback voltage for each adjusting of the up codes is different from each other, and
wherein the code generator adjusts the up codes in order from a largest increment to a smallest increment, respectively.

3. The voltage trimming circuit of claim 2, wherein after adjusting one of the up codes, the code generator is configured to adjust next up codes when the comparison result continues to indicate the feedback voltage is to be increased, and the code generator is configured to not adjust the next up codes when the comparison result indicates the feedback voltage is to be decreased.

4. The voltage trimming circuit of claim 1, wherein an amount of decrement in the feedback voltage for each adjusting of the down codes is different, and
wherein the code generator adjusts the down codes in order from a largest decrement to a smallest decrement, respectively.

5. The voltage trimming circuit of claim 4, wherein after adjusting one of the down codes, the code generator is configured to adjust next down codes when the comparison result continues to indicate the feedback voltage is to be decreased, and the code generator is configured not to adjust the next down codes when the comparison result indicates the feedback voltage is to be increased.

6. The voltage trimming circuit of claim 1, wherein the nonvolatile storage device includes an anti-fuse array including a plurality of anti-fuses and programs the plurality of final trimming codes into the anti-fuse array.

7. The voltage trimming circuit of claim 6, wherein anti-fuses corresponding to the up codes maintained at the initial value are not ruptured when the feedback voltage is greater than the reference voltage, and
wherein anti-fuses corresponding to the down codes maintained at the initial value are not ruptured when the feedback voltage is less than the reference voltage.

8. The voltage trimming circuit of claim 1, wherein the comparator performs offset cancellation before comparing the reference voltage with the feedback voltage.

9. The voltage trimming circuit of claim 1, further comprising:
an accumulation circuit configured to accumulate the comparison result of the comparator and to determine whether the feedback voltage is greater than or less than the reference voltage, based on an accumulated comparison result,
wherein the code generator adjusts the plurality of trimming codes based on the accumulated comparison result of the accumulation circuit.

10. An operating method of a voltage trimming circuit, the method comprising:
comparing a reference voltage with a feedback voltage by using a comparator;
adjusting up codes to increase the feedback voltage and down codes to decrease the feedback voltage; and
programming the up codes and the down codes in an anti-fuse array including a plurality of anti-fuses after the up codes and the down codes are adjusted,
wherein the adjusting comprises
setting values of the up codes so that the feedback voltage is to be increased and maintaining the down codes as an initial value when a comparison result of the comparing indicates that the feedback voltage is to be increased, and setting values of the down codes so that the feedback voltage is to be decreased and maintaining the up codes as the initial value when the comparison result indicates that the feedback voltage is to be decreased.

11. The method of claim 10, wherein the comparing comprises:
performing offset cancellation of the comparator;
accumulating the comparison result of the comparator; and
determining the feedback voltage is greater than or less than the reference voltage, based on the accumulated comparison result.

12. The method of claim 10, wherein an amount of increment in the feedback voltage for each adjusting of the up codes is different from each other,
wherein the adjusting comprises adjusting the up codes in order from a largest increment to a smallest increment respectively, and further adjusting next up codes when the comparison n result continues to indicate the feedback voltage is to be increased, and
wherein the next up codes are not adjusted when the comparison result indicates the feedback voltage is to be decreased.

13. The method of claim 10, wherein
an amount of decrement in the feedback voltage for each adjusting of the down codes is different from each other,
wherein the adjusting comprises adjusting the down codes in order from a largest decrement to a smallest decrement respectively, and further adjusting next down codes when the comparison result continues to indicate the feedback voltage is to be decreased, and
wherein the next down codes are adjusted when the comparison result indicates the feedback voltage is to be increased.

14. The method of claim 10, wherein the programming comprises:

latching the up codes and the down codes; and rupturing anti-fuses corresponding to the latched up codes and the latched down codes, based on values of the latched up codes and the latched down codes.

15. The method of claim 10, further comprising:

generating the feedback voltage depending on the up codes and the down codes programmed in the anti-fuse array.

16. An integrated circuit comprising:

a first switch circuit configured to select an internal voltage from among a plurality of internal voltages of the integrated circuit;

a comparator configured to compare the selected internal voltage with a reference voltage;

a code generator configured to adjust a plurality of trimming codes for trimming each of the plurality of internal voltages based on a comparison result of the comparator;

a nonvolatile storage device configured to store a plurality of final trimming codes adjusted by the code generator;

a second switch circuit configured to select the plurality of trimming codes during a trimming mode and to select the plurality of final trimming codes after the trimming mode; and a plurality of voltage generators configured to generate the plurality of internal voltages based on the plurality of trimming codes selected by the second switch circuit, wherein each of the plurality of trimming codes includes up codes to increase the plurality of internal voltages and down codes to decrease the plurality of internal voltages, wherein when the code generator adjusts any of the up codes and the down codes, the code generator maintains others of the up codes and the down codes with an initial value.

17. The integrated circuit of claim 16, wherein the code generator adjusts up codes of a trimming code from among the plurality of trimming codes for trimming the selected internal voltage when the selected internal voltage is less than the reference voltage and adjusts down codes of the trimming code for trimming the selected internal voltage when the selected internal voltage is greater than the reference voltage.

18. The integrated circuit of claim 17, wherein after adjusting one of the up codes, the code generator changes the one of the up codes to a value before the adjustment when the selected internal voltage is greater than the reference voltage.

19. The integrated circuit of claim 17, wherein after adjusting one of the down codes, the code generator changes the one of the down codes to a value before the adjustment when the selected internal voltage is less than the reference voltage.

20. The integrated circuit of claim 16, wherein the nonvolatile storage device includes an anti-fuse array including a plurality of anti-fuses and programs the anti-fuse array depending on the plurality of final trimming codes.

* * * * *